(12) United States Patent
Sung et al.

(10) Patent No.: US 10,070,543 B2
(45) Date of Patent: Sep. 4, 2018

(54) POWER ADAPTER

(71) Applicants: LITE-ON ELECTRONICS (GUANGZHOU) LIMITED, Guangzhou (CN); Lite-On Technology Corporation, Taipei (TW)

(72) Inventors: Chih-Pin Sung, Taipei (TW); Kuo-Lung Chang, Taipei (TW); Yi-Ling Chen, Taipei (TW); Kun-Hua Tsai, Taipei (TW); Zih-Yi Yang, Taipei (TW)

(73) Assignees: LITE-ON ELECTRONICS (GUANGZHOU) LIMITED, Guangzhou (CN); Lite-On Technology Corporation, Taipei (TW)

(*) Notice: Subject to any disclaimer, the term of this patent is extended or adjusted under 35 U.S.C. 154(b) by 0 days.

(21) Appl. No.: 15/350,122

(22) Filed: Nov. 14, 2016

(65) Prior Publication Data
US 2018/0027674 A1  Jan. 25, 2018

Related U.S. Application Data

(60) Provisional application No. 62/364,323, filed on Jul. 20, 2016.

(51) Int. Cl.
| | |
|---|---|
| *H05K 5/00* | (2006.01) |
| *H05K 7/14* | (2006.01) |
| *H01F 38/14* | (2006.01) |
| *H01F 27/06* | (2006.01) |
| *H01R 12/72* | (2011.01) |

(52) U.S. Cl.
CPC ........... *H05K 5/0069* (2013.01); *H01F 27/06* (2013.01); *H01F 38/14* (2013.01); *H01R 12/724* (2013.01); *H05K 7/1427* (2013.01); *H01F 2027/065* (2013.01)

(58) Field of Classification Search
CPC ........ H01F 27/06; H01F 27/292; H01F 38/14; H01F 2027/065; H01R 12/724;
(Continued)

(56) References Cited

U.S. PATENT DOCUMENTS

| 5,806,960 A * | 9/1998 | Chien | A43B 1/0036 |
|---|---|---|---|
| | | | 362/190 |
| 6,563,056 B1 * | 5/2003 | Belwon | H05K 1/0256 |
| | | | 174/260 |

(Continued)

FOREIGN PATENT DOCUMENTS

| CN | 105914537 | 8/2016 |
|---|---|---|
| JP | H04255296 | 9/1992 |
| WO | 2015163143 | 10/2015 |

OTHER PUBLICATIONS

Office Action of Taiwan Counterpart Application, dated May 14, 2018, p. 1-p. 10.

*Primary Examiner* — Timothy Thompson
*Assistant Examiner* — Guillermo Egoavil
(74) *Attorney, Agent, or Firm* — JCIPRNET

(57) ABSTRACT

A power adapter including a first substrate, a second substrate, a transformer and an insulating frame is provided. The first substrate includes a first terminal set. The second substrate includes a second terminal set. The transformer includes a primary side connection terminal and a secondary side connection terminal, wherein the primary side connection terminal is connected to the first terminal set and the secondary side connection terminal is connected to the second terminal set. The insulating frame is disposed between the first substrate and the second substrate, and the transformer leans against the insulating frame.

17 Claims, 8 Drawing Sheets

(58) Field of Classification Search
CPC .......... H02M 3/00; H02M 3/28; H02M 7/003; H02M 7/44; H05K 1/18; H05K 1/145; H05K 1/0256; H05K 3/30; H05K 5/0069; H05K 7/1427; H05K 7/20927; H05K 2201/1003; H05K 2201/10424; Y10T 29/4913
USPC .................... 29/832; 336/192; 361/752, 784; 363/127, 123
See application file for complete search history.

(56) References Cited

U.S. PATENT DOCUMENTS

| | | | | |
|---|---|---|---|---|
| 6,987,678 | B2 * | 1/2006 | Giandalia | H01F 19/08 363/127 |
| 2004/0132323 | A1 * | 7/2004 | Saka | H01R 43/20 439/79 |
| 2006/0145800 | A1 * | 7/2006 | Dadafshar | H01F 27/2847 336/82 |
| 2012/0002387 | A1 * | 1/2012 | Park | H01F 27/325 361/760 |
| 2012/0188712 | A1 * | 7/2012 | Ishibashi | H02M 7/003 361/688 |
| 2013/0077276 | A1 * | 3/2013 | Kippley | H02M 7/003 361/784 |
| 2014/0197914 | A1 * | 7/2014 | Go Chua | H05K 3/30 336/192 |
| 2014/0308853 | A1 * | 10/2014 | Colahan | H01R 13/6675 439/628 |
| 2017/0040907 | A1 * | 2/2017 | Goto | H02M 3/28 |
| 2017/0331378 | A1 * | 11/2017 | Song | H02M 1/126 |

* cited by examiner

POWER ADAPTER

CROSS-REFERENCE TO RELATED APPLICATION

This application claims the priority benefit of U.S. provisional application No. 62/364,323, filed on Jul. 20, 2016. The entirety of the above-mentioned patent application is hereby incorporated by reference herein and made a part of this specification.

BACKGROUND OF THE INVENTION

Field of the Invention

The present invention relates to a power adapter, and particularly relates to a power adapter which is smaller in size.

Description of Related Art

In general, there are different types of transformers to meet different functional requirements. When the transformer is designed, the performance specifications, such as transformation ratio, electric current, loss, size, etc., need to be considered. Under the circumstance that the power performance of the transformer meets the requirement, the transformer with smaller size can be applied to more variety of electronic devices. Since there are high currents and great voltage variation in the transformer while operating, the transformer needs going through strict safety tests to ensure the safety in use. However, in order to meet safety requirements, the size of the transformer is usually increased to provide enough insulation distance between coils. Overall, with the same electrical characteristics, the "miniaturization" of the transformer is limited due to the safety requirements, and since the insulation reliability of the transformer needs to be considered, and the influence on the power waveform of the primary and the secondary side of the transformer when being installed in the circuit also needs to be concerned, the above-mentioned considerations may limit the size range and the application of the transformer.

SUMMARY OF THE INVENTION

The present invention provides a power adapter having a higher internal space usage, so as to reduce the overall volume thereof.

The power adapter of the present invention includes a first substrate, a second substrate, a transformer, and an insulating frame. The first substrate includes a first terminal set. The second substrate includes a second terminal set. The transformer includes a primary side connection terminal and a secondary side connection terminal, wherein the primary side connection terminal is connected to the first terminal set, and the secondary side connection terminal is connected to the second terminal set. The insulating frame is disposed between the first substrate and the second substrate, and the transformer leans against the insulating frame.

In an embodiment of the present invention, the power adapter further includes at least one primary side component and at least one secondary side component, wherein the primary side component is disposed on the first substrate and coupled to the primary side connection terminal, the secondary side component is disposed on the second substrate and coupled to the secondary side connection terminal, and the insulating frame is configured to isolate the primary side component and the secondary side component from one another.

In an embodiment of the present invention, the first substrate and the second substrate are substantially parallel to each other, and the first substrate and the second substrate are located on two opposite sides of the transformer.

In an embodiment of the present invention, the first substrate and the second substrate are substantially perpendicular to each other, and the transformer is connected between the first substrate and the second substrate.

In an embodiment of the present invention, a creepage distance from the primary side connection terminal to the secondary side connection terminal is substantially greater than or equal to 6.5 mm.

In an embodiment of the present invention, the thickness of the insulating frame is substantially greater than or equal to 0.7 mm.

In an embodiment of the present invention, the power adapter further includes a plurality of functional pins, and each of the functional pins connects the first substrate and the second substrate.

In an embodiment of the present invention, the power adapter further includes a plurality of fixed pins and a frame ground circuit, and the frame ground circuit is disposed on the second substrate.

In an embodiment of the present invention, the power adapter further includes a connecting port disposed on the second substrate or the first substrate and electrically connected to an external electronic component.

In an embodiment of the present invention, the power adapter further includes a shielding case covering at least a part of the transformer, the first substrate, and the second substrate.

Based on the above, in the embodiments of the present invention, the transformer of the power adapter is disposed in an upright state to be connected between the first substrate and the second substrate, so that the transformer is disposed on the substrates with its side surface having a smaller surface area, such that the transformer takes up less space on the substrates. Therefore, the usage of the internal space in the power adapter is increased, so the size of the power adapter is reduced. Moreover, the insulating frame of the invention is configured to isolate the primary side connection terminal and the secondary side connection terminal of the transformer from one another while also support the transformer to be disposed in the upright state. Therefore, in the present invention, the overall volume of the power adapter can be effectively reduced, and the structural reliability of the power adapter is improved.

In order to make the aforementioned and other features and advantages of the invention more comprehensible, embodiments accompanying figures are described in details below.

DESCRIPTION OF THE EMBODIMENTS

Figure 1:
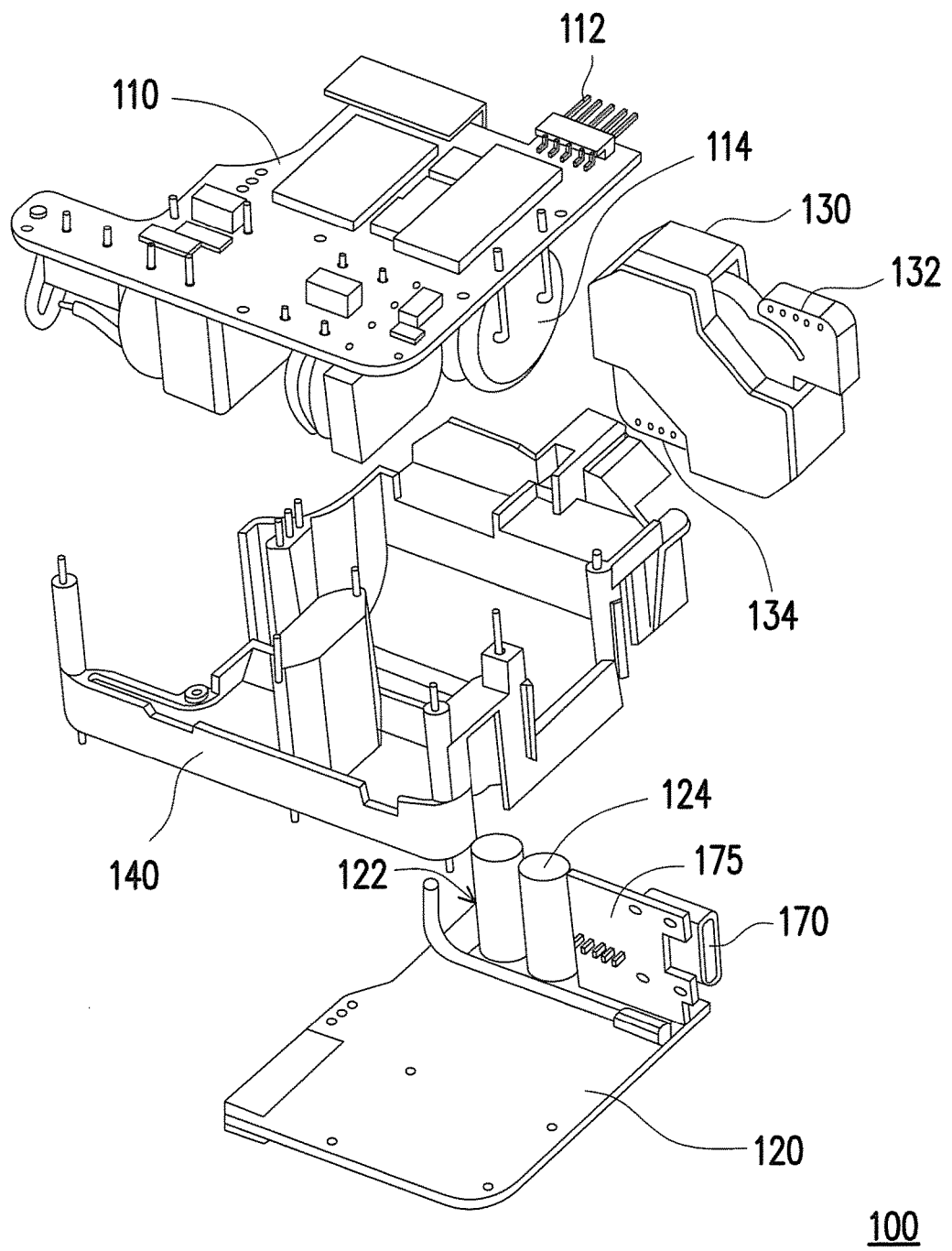
FIG. 1 is an exploded schematic view of a power adapter according to an embodiment of the present invention.

In the following detailed description of the preferred embodiment, reference is made to the accompanying drawings which form a part hereof, and in which are shown by way of illustration specific embodiment in which the invention may be practiced. In this regard, the directional terminologies, such as "top", "bottom", "left", "right", "front", or "back", etc., are used with reference to the orientation of the Figure(s) being described. Accordingly, the drawings and descriptions will be regarded as illustrative in nature and not as restrictive. In the following embodiments, the same reference numbers are used in the drawings and the description to refer to the same or similar elements.

Figure 2:
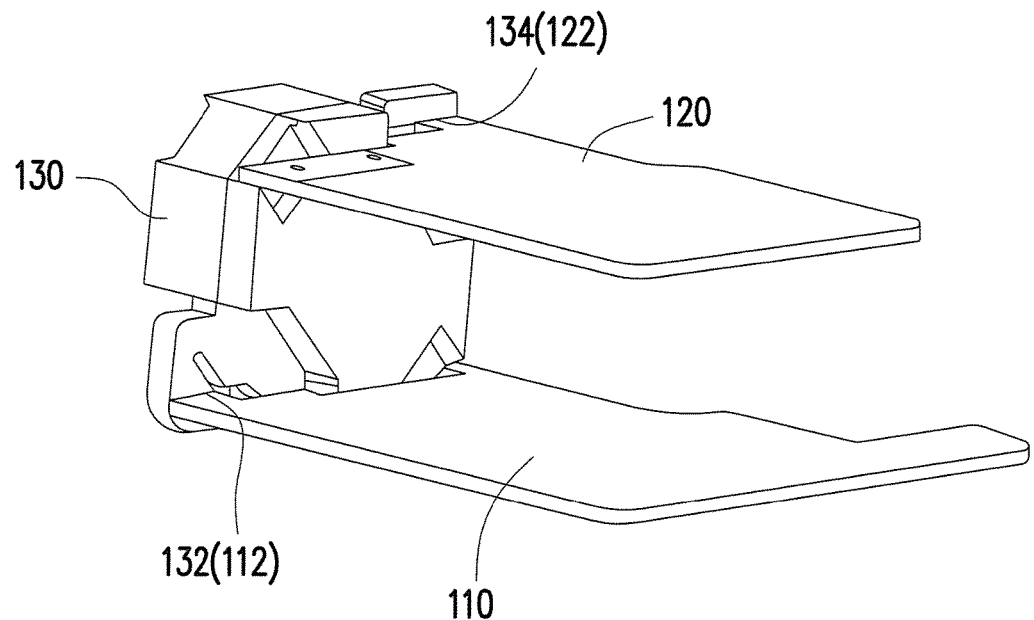
FIG. 2 is a schematic view of assembling a first substrate, a second substrate, and a transformer of the power adapter in FIG. 1.
Figure 3:
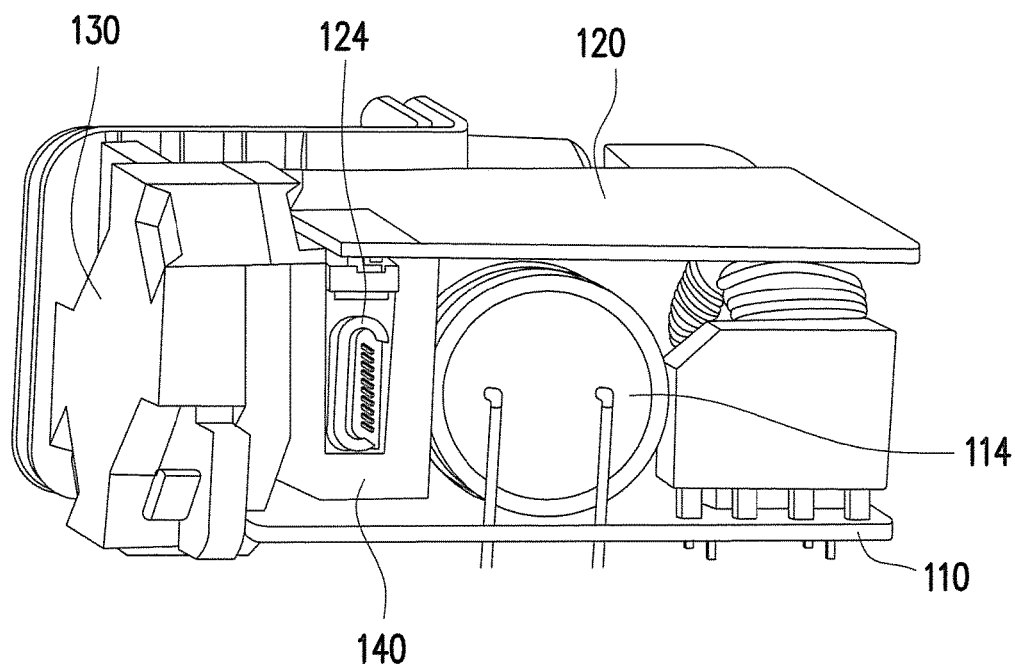
FIG. 3 is a schematic view of the power adapter in FIG. 1.

FIG. 1 is an exploded schematic view of a power adapter according to an embodiment of the present invention. FIG. 2 is a schematic view of assembling a first substrate, a second substrate, and a transformer of the power adapter in FIG. 1. FIG. 3 is a schematic view of the power adapter in FIG. 1. Referring to FIG. 1 to FIG. 3, in the present embodiment, a power adapter 100 includes a first substrate 110, a second substrate 120, a transformer 130, and an insulating frame 140. The first substrate 110 includes a first terminal set 112, and the second substrate 120 includes a second terminal set 122. The transformer 130 includes a primary side connection terminal 132 and a secondary side connection terminal 134, wherein the primary side connection terminal 132 is connected to the first terminal set 112 of the first substrate 110, and the secondary side connection terminal 134 is connected to the second terminal set 122 of the second substrate 120. The insulating frame 140 is disposed between the first substrate 110 and the second substrate 120, the transformer 130 is in an upright state as shown in FIG. 1 and respectively connected between the first substrate 110 and the second substrate 120, and the transformer 130 leans against the insulating frame 140. In the present embodiment, the first substrate 110 may be a motherboard, and the second substrate 120 may be a micro-ATX for example. Certainly, the present embodiment is merely illustrated as an example, the invention is not limited thereto.

With this configuration, in the present embodiment, the transformer 130 is in the upright state and connected between the first substrate 110 and the second substrate 120. In other words, the transformer 130 is disposed on the first substrate 110 and the second substrate 120 with its side surface having smaller surface area, such that the transformer 130 takes up less space on the first substrate 110 and the second substrate 120. Therefore, the usage of the internal space in the power adapter 100 is increased, and the volume of the power adapter 100 can be reduced. Moreover, the insulating frame 140 is configured to not only isolate the primary side connection terminal 132 and the secondary side connection terminal 134 of the transformer 130 from one another but also support the transformer 130 to be disposed in the upright state.

More specifically, the power adapter 100 of the present embodiment may further include at least one primary side component 114 and at least one secondary side component 124 as shown in FIG. 1 and FIG. 3, wherein the primary side component 114 is coupled to the transformer 130 and may be disposed on the first substrate 110 as shown in FIG. 3, and the secondary side component 124 is coupled to the transformer 130 and may be disposed on, for example, the second substrate 120 as shown in FIG. 3. By this way, the insulating frame 140 is configured to isolate the primary side component 114 and the secondary side component 124 from one another, as shown in FIG. 3. In the present embodiment, the thickness of the insulating frame 140 is approximately greater than or equal to 0.7 mm, so the insulating frame 140 can provide excellent insulation and excellent supporting strength for the transformer 130.

In the present embodiment, the first substrate 110 and the second substrate 120 are substantially parallel to each other as shown in FIG. 2, and the transformer 130 is connected between the first substrate 110 and the second substrate 120. More specifically, as shown in FIG. 2, the primary side connection terminal 132 and the secondary side connection terminal 134 of the transformer 130 are respectively located on two opposite sides of the transformer 130. Therefore, the transformer 130 may be disposed in the upright state, so the first substrate 110 and the second substrate 120 are substantially parallel to each other in order to be respectively connected to the primary side connection terminal 132 and the secondary side connection terminal 134 of the transformer 130, as shown in FIG. 2. In addition, the term "substantially parallel to" indicates that an angle between extension lines of the first substrate 110 and the second substrate 120 may range from 0 to 5 degrees.

In the present embodiment, as shown in FIG. 1, the power adapter 100 further includes a connecting port 170 and a connecting port substrate 175, wherein the connecting port 170 is disposed on the second substrate 120. In detail, the connecting port 170 is disposed on the connecting port substrate 175, and the connecting port substrate 175 is disposed on the second substrate 120. In other words, the connecting port 170 is disposed on the second substrate 120 via the connecting port substrate 175, so the connecting port 170 is coupled to the secondary side connection terminal 134 of the transformer 130 via the second substrate 120. As a result, the power adapter 100 may be electrically connected to an external electronic component through the connecting port 170. In the present embodiment, the connecting port 170 may include an USB Type-C. Certainly, the present embodiment is merely illustrated as an example, the type and the formations of the connecting port in the invention are not limited thereto.

Figure 4A:
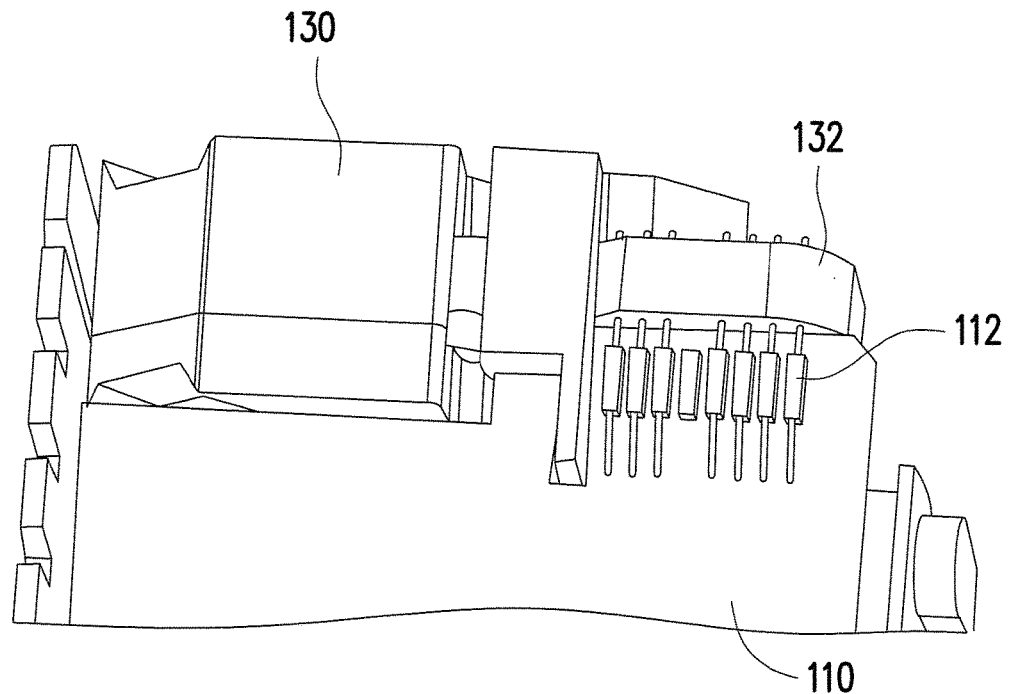
FIG. 4A is a partial enlarged schematic view of a primary side connection terminal of the power adapter in FIG. 1.
Figure 4B:
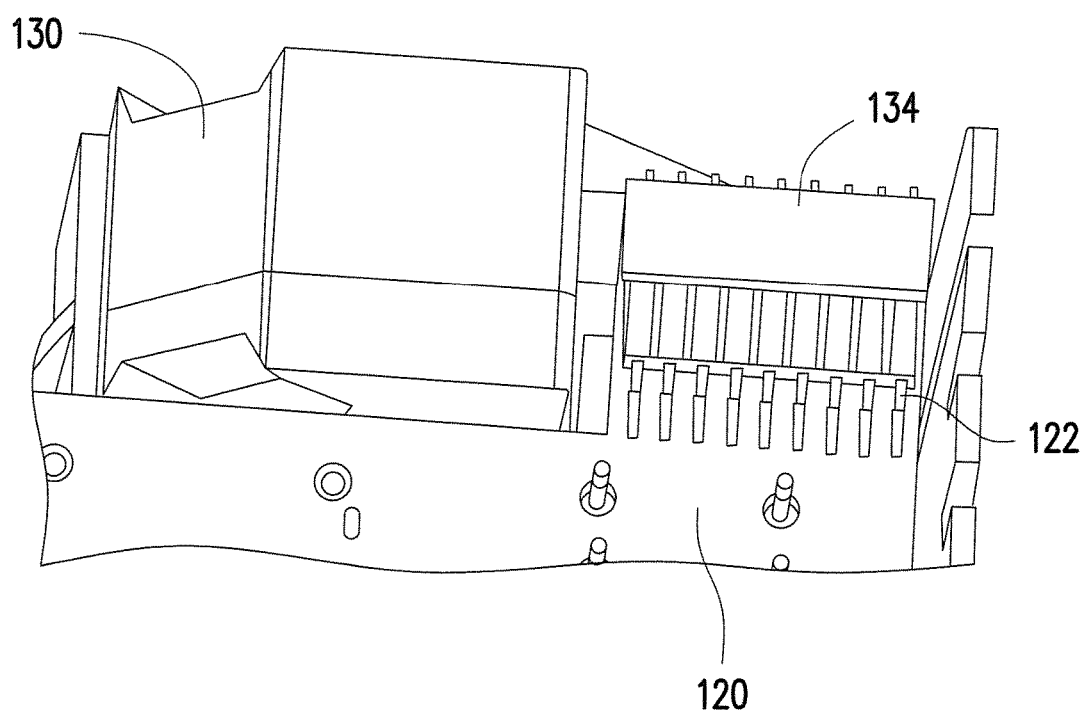
FIG. 4B is a partial enlarged schematic view of a secondary side connection terminal of the power adapter in FIG. 1.

FIG. 4A is a partial enlarged schematic view of a primary side connection terminal of the power adapter in FIG. 1. FIG. 4B is a partial enlarged schematic view of a secondary side connection terminal of the power adapter in FIG. 1. Referring to FIG. 4A and FIG. 4B, in the present embodiment, the first terminal set 112 of the first substrate 110 may include a plurality of first pins as shown in FIG. 4A, and the primary side connection terminal 132 correspondingly includes a plurality of first slots configured to receive the first pins respectively. Similarly, the second terminal set 122 of the second substrate 120 may include a plurality of second pins as shown in FIG. 4B, and the secondary side connection terminal 134 correspondingly includes a plurality of second slots configured to receive the second pins of the second substrate 120 respectively. In the present embodiment, the number of the first pins disposed at the first substrate 110 may be 7, and the number of the second pins disposed at the second substrate 120 may be 9 for example. Certainly, the present embodiment is merely illustrated as an example, the number of pins of the terminal sets 112 and 122 and the shape of the terminal sets are not limited in the present invention. In other embodiments, the terminal sets 112 and 122 may include slots or other terminals in suitable formations to be engaged with the primary side connection terminal 132 and the secondary side connection terminal 134 respectively, so as to form electrical connections.

Figure 5:
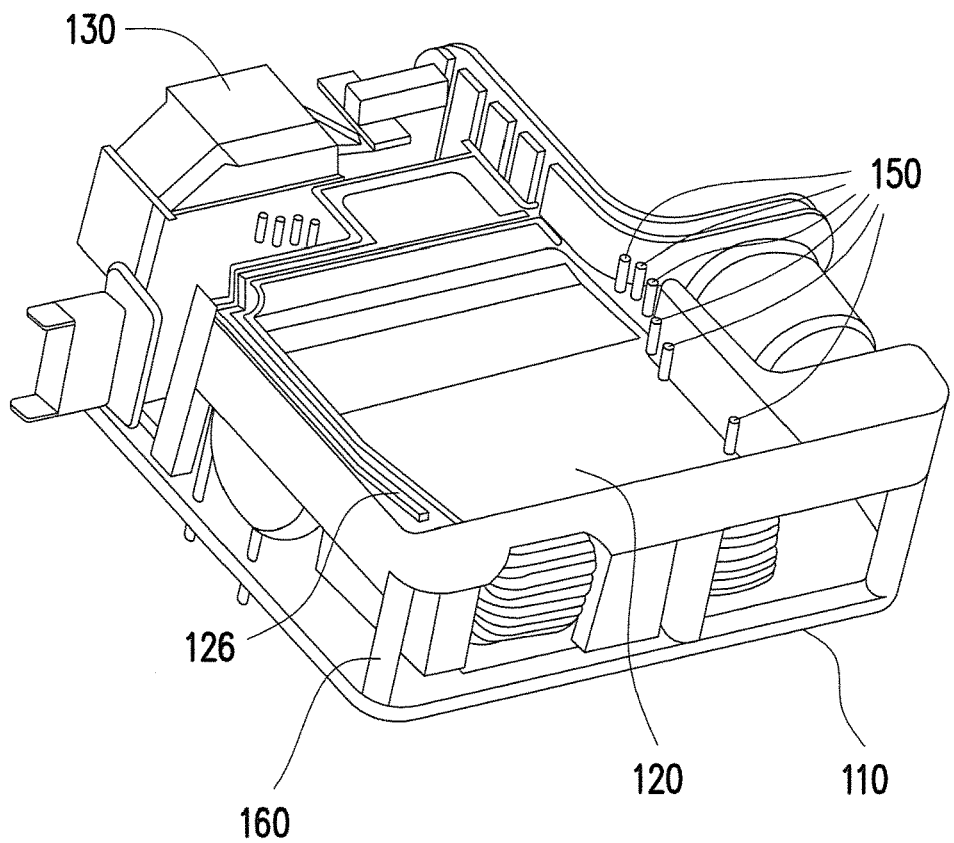
FIG. 5 is a schematic view of the power adapter in FIG. 1 at a different angle.
Figure 6:
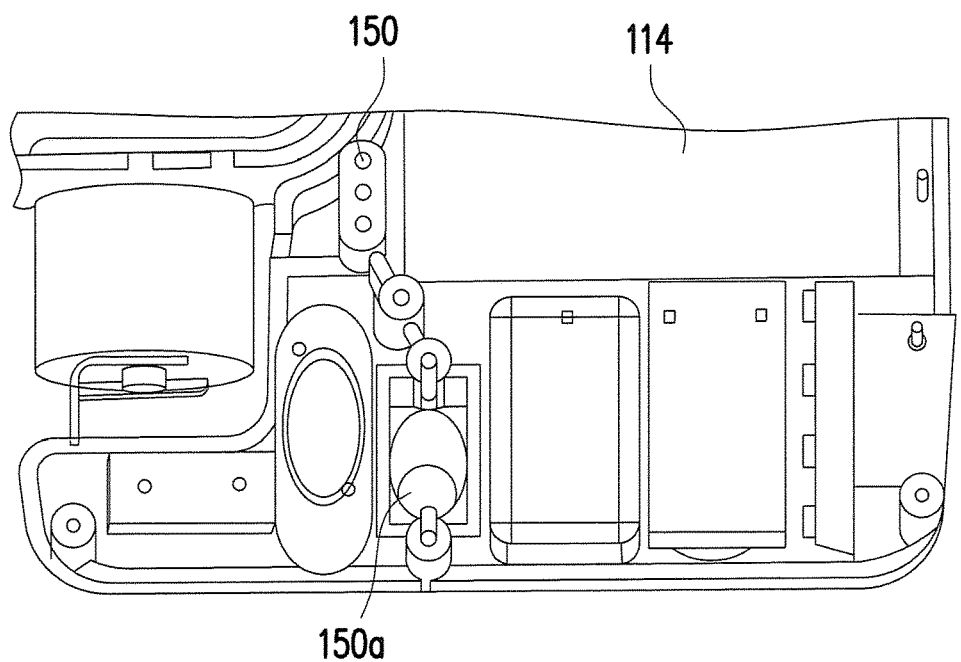
FIG. 6 is a partial cross-sectional view of the power adapter in FIG. 1.

FIG. 5 is a schematic view of the power adapter in FIG. 1 at a different angle. FIG. 6 is a partial cross-sectional view of the power adapter in FIG. 1. Referring to FIG. 5 and FIG. 6, in the present embodiment, the power adapter 100 may further include a plurality of functional pins 150, a plurality of fixed pins 160, and a frame ground circuit 126 as shown in FIG. 5, wherein each of the functional pins 150 may penetrate through the first substrate 110 and the second substrate 120 respectively, so as to connect the first substrate 110 and the second substrate 120. The frame ground circuit 126 is disposed on the second substrate 120 and connected to a ground voltage. The fixed pins 160 may be connected to the frame ground circuit 126 by, for example, welding or the like. Moreover, in an embodiment of the invention, the power adapter 100 may adopt a Y-capacitor 150a to replace the functional pins 150 as shown in FIG. 6. Accordingly, by reducing the use of pins in manufacturing process, the difficulty in forming the insulating frame 140 can be reduced.

Figure 7:
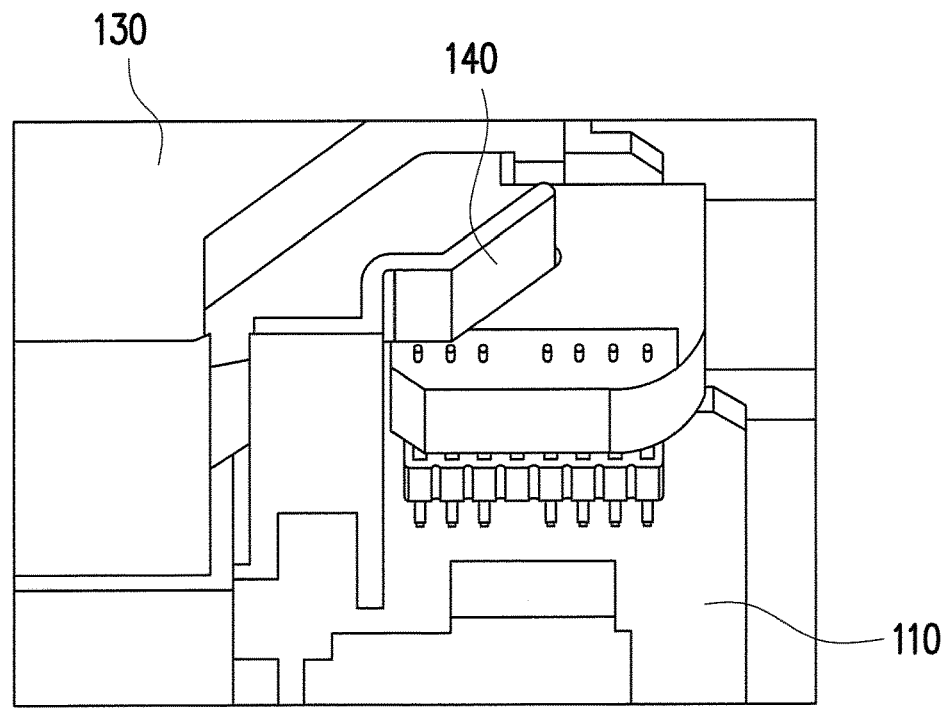
FIG. 7 is a schematic view of the primary side connection terminal of the power adapter in FIG. 1.
Figure 8:
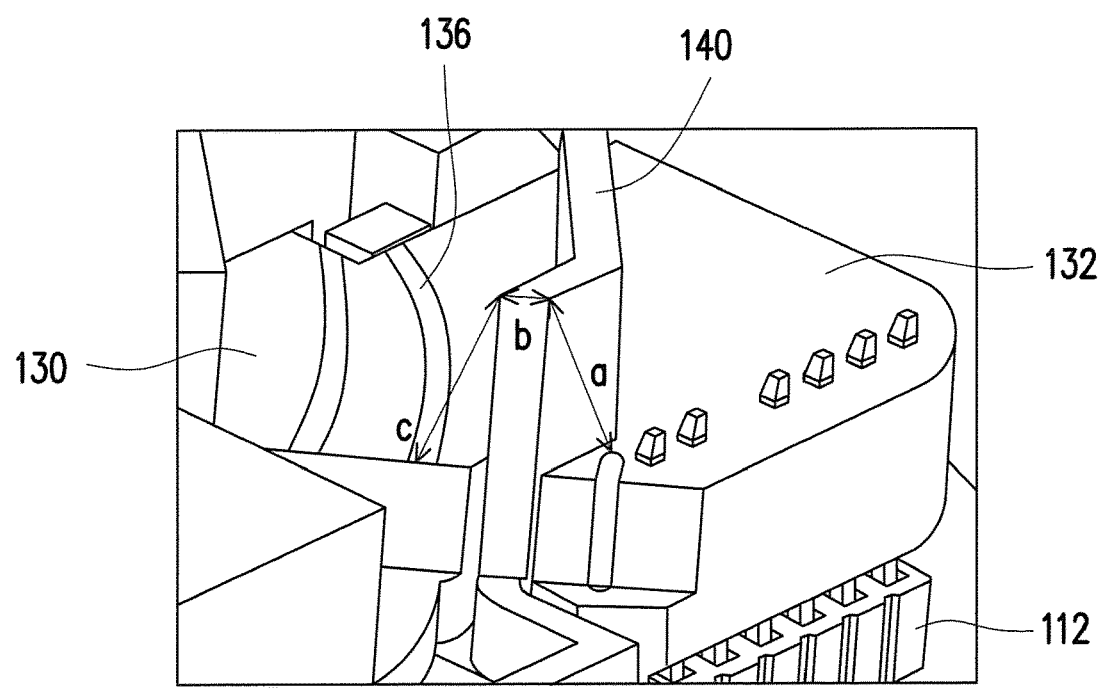
FIG. 8 is a partial enlarged schematic view of the primary side connection terminal of the power adapter in FIG. 1.

FIG. 7 is a schematic view of the primary side connection terminal of the power adapter in FIG. 1. FIG. 8 is a partial enlarged schematic view of the primary side connection terminal of the power adapter in FIG. 1. Referring to FIG. 7 and FIG. 8, in general, the primary side connection terminal 132 and the secondary side connection terminal 134 are isolated by the insulating frame 140 disposed therebetween. However, the core and the internal circuit of the transformer 130 are deemed as the secondary side component as well. Therefore, in order to ensure that distances from the internal circuit 136 of the transformer 130 to the primary side connection terminal 132 and the first terminal set 112 all satisfy the safety distance requirement to prevent the creepage phenomenon, in the present embodiment, a creepage distance from the primary side connection terminal 132 to the secondary side connection terminal 134, and a creepage distance from the primary side connection terminal 132 to the core and the internal circuit of the transformer 130 are designed to be substantially greater than or equal to 6.5 mm, so as to prevent the creepage phenomenon. The creepage distance in the present embodiment may be equal to the sum of the distance a, the distance b, and the distance c illustrated in FIG. 8.

Figure 9:
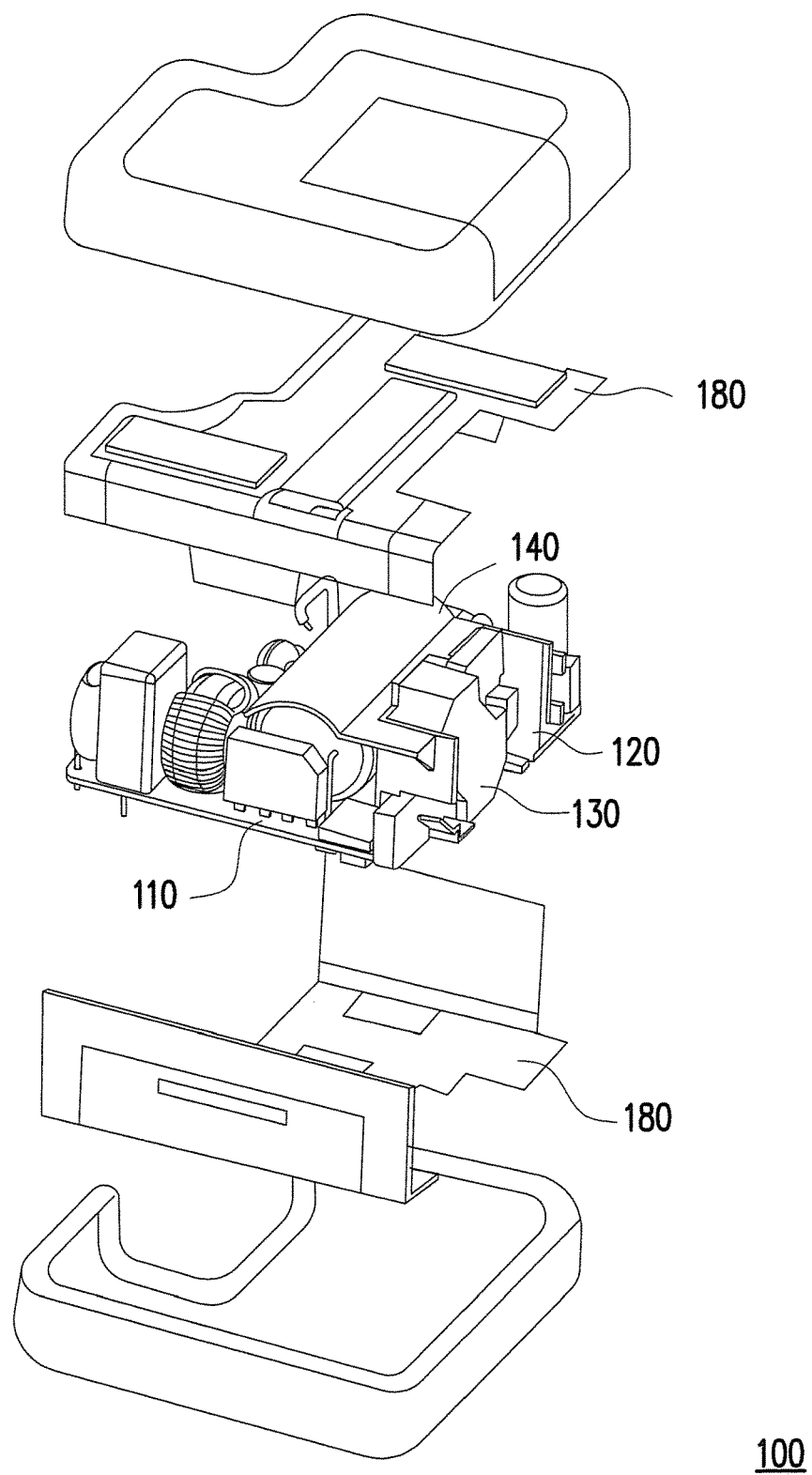
FIG. 9 is an exploded schematic view of a power adapter according to an embodiment of the present invention.
Figure 10:
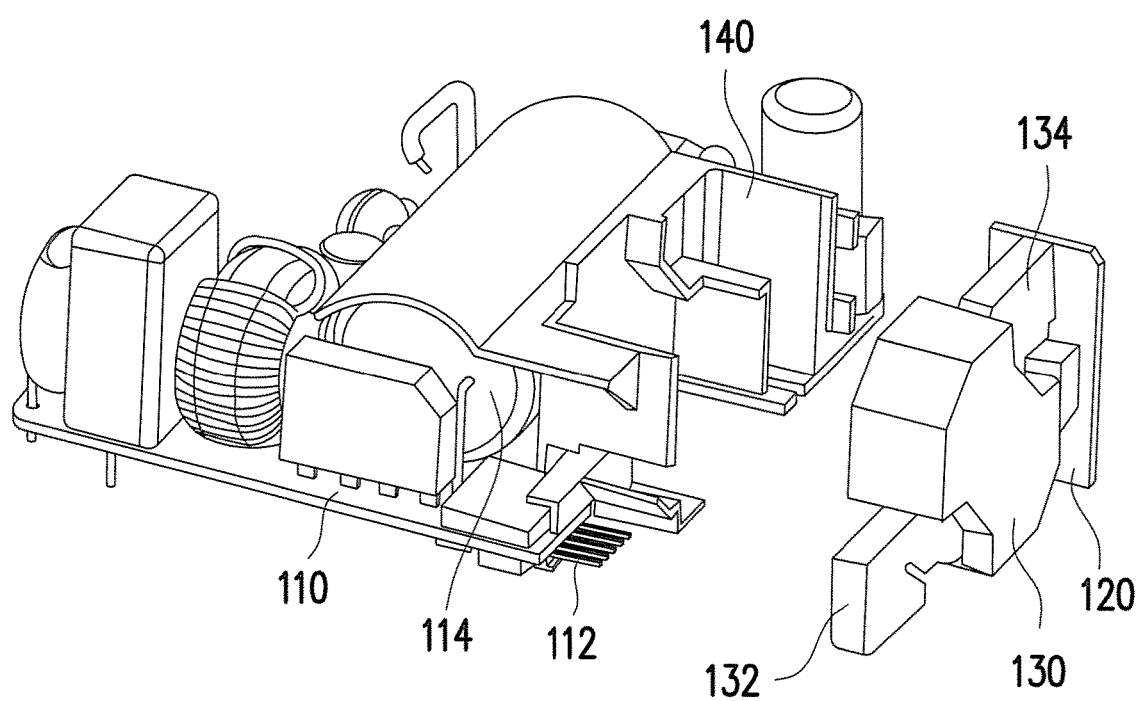
FIG. 10 is an exploded schematic view of some components of the power adapter in FIG. 9.
Figure 11:
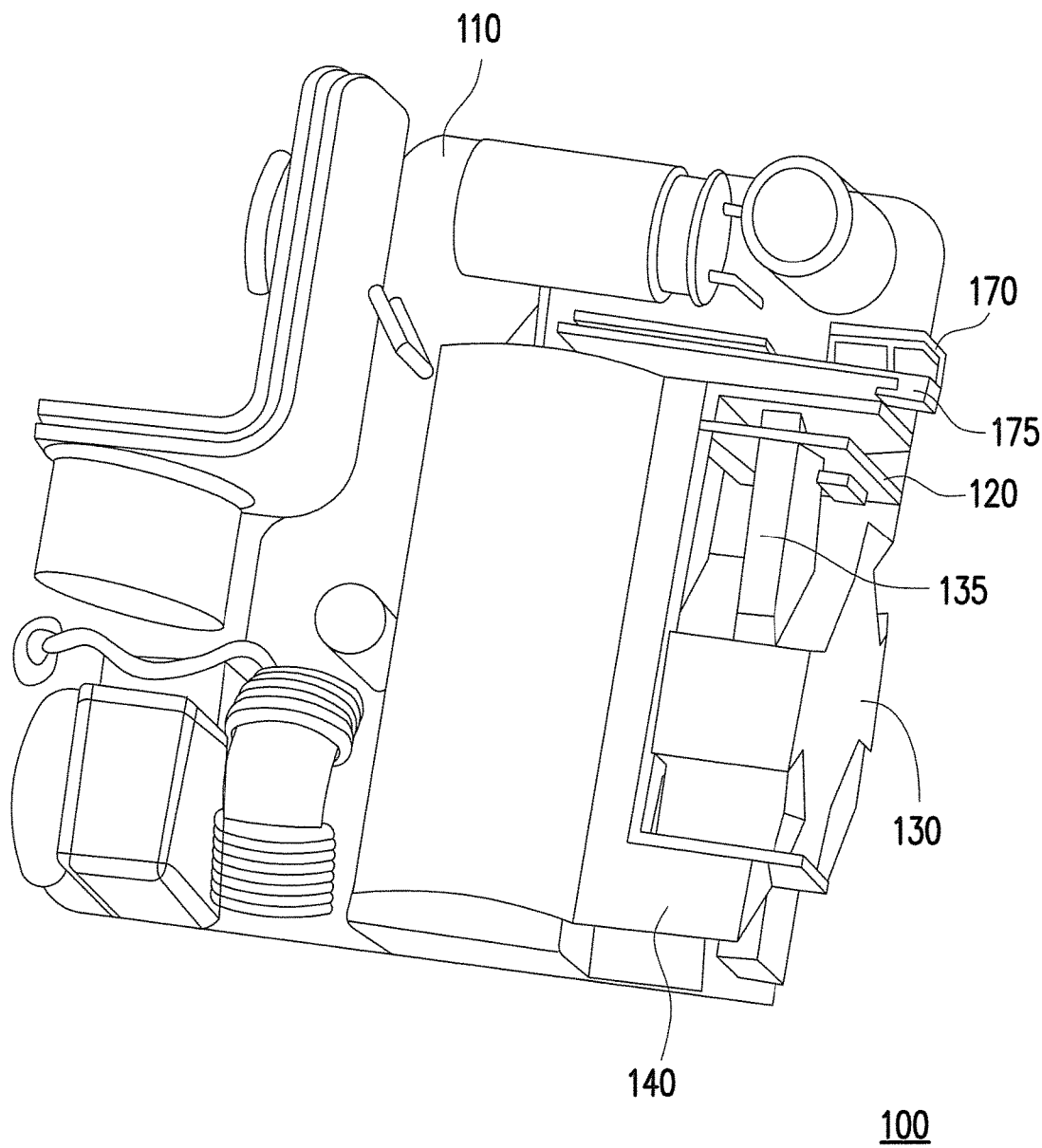
FIG. 11 is a schematic top view of the power adapter in FIG. 10.

FIG. 9 is an exploded schematic view of a power adapter according to an embodiment of the invention. FIG. 10 is an exploded schematic view of some components of the power adapter in FIG. 9. FIG. 11 is a schematic top view of the power adapter in FIG. 10. It should be noted here, the power adapter 100 in the present embodiment is similar to the power adapter 100 in FIG. 1. Hence, the present embodiment utilizes the same labels and partial contents of the above embodiment, wherein the same labels are adopted to represent same or similar elements and the description of similar technical content is omitted. Regarding the description of the omitted parts, reference may be made to the previous embodiment, and will not be repeated in the below embodiment. Referring to FIG. 9 to FIG. 11, the differences between the power adapter 100 in the present embodiment and the power adapter 100 in FIG. 1 are described as followings.

In the present embodiment, as shown in FIG. 10, the first substrate 110 and the second substrate 120 are disposed substantially perpendicular to each other, and the primary side connection terminal 132 and the secondary side connection terminal 134 of the transformer 130 are respectively located on two adjacent sides of the transformer 130, so the transformer 130 may be connected between the first substrate 110 and the second substrate 120. In detail, referring to FIG. 10 and FIG. 11, the transformer 130 may further include a transfer substrate 135 as shown in FIG. 11, so the primary side connection terminal 132 and the secondary side connection terminal 134 may be respectively connected to the first terminal set 112 of the first substrate 110 and the second terminal set 122 of the second substrate 120 through the transfer substrate 135. With this configuration, the transformer 130 of the present embodiment may be in the upright state and may also lean against the insulating frame 140, so as to connect to the first substrate 110 and the second substrate 120 which are substantially perpendicular to each other. The insulating frame 140 is configured to isolate the primary side connection terminal 132 and the secondary side connection terminal 134 of the transformer 130 from one another and further support the transformer 130 to be disposed in the upright state. The term "substantially perpendicular to" indicates that an angle between extension lines of the first substrate 110 and the second substrate 120 may range from 85 to 90 degrees.

In an embodiment of the present invention, as shown in FIG. 9, the power adapter 100 may further include a shielding case 180 at least covering a part of the transformer 130, the first substrate 110, and the second substrate 120 to prevent electromagnetic interference. It should be noted that the power adapter 100 in the previous embodiment may also include the shielding case 180. In addition, the power adapter 100 in the present embodiment may also include the connecting port 170 and the connecting port substrate 175 shown in FIG. 11. In the present embodiment, the connecting port 170 is disposed on the connecting port substrate 175, and the connecting port substrate 175 may be disposed on the first substrate 110, so the power adapter 100 may be electrically connected to an external electronic component through the connecting port 170. In the present embodiment, the connecting port 170 may include an USB Type-C. Certainly, the present embodiment is merely illustrated as an example, the type and formation of the connecting port in the invention are not limited thereto.

In sum, the transformer in the present invention is disposed in the upright state to be connected between the first substrate and the second substrate, so that the transformer is disposed on the substrates with its side surface having a smaller surface area, so the space occupied by the transformer on the substrates can be reduced, so as to increase the usage of the internal space in the power adapter and reduce the size of the power adapter. Moreover, the insulating frame of the invention is disposed between the first substrate and the second substrate, so the insulating frame is configured to not only isolate the primary side connection terminal and the secondary side connection terminal from one another but also support the transformer to be disposed in the upright state. Therefore, the volume of the power adapter in the present invention can be effectively reduced, and the structural reliability of the power adapter can also be effectively improved.

Although the invention has been disclosed with reference to the aforesaid embodiments, they are not intended to limit the invention. It will be apparent to one of ordinary skill in the art that modifications and variations to the described embodiments may be made without departing from the spirit and the scope of the invention. Accordingly, the scope of the invention will be defined by the attached claims and not by the above detailed descriptions.

What is claimed is:

1. A power adapter, comprising:
   a first substrate, comprising a first terminal set;
   a second substrate, comprising a second terminal set;
   a transformer, comprising a primary side connection terminal and a secondary side connection terminal, wherein the primary side connection terminal is connected to the first terminal set and the secondary side connection terminal is connected to the second terminal set; and
   an insulating frame, disposed between the first substrate and the second substrate,
   wherein the transformer comprises a first side surface and a second side surface opposite to the first side surface, the primary side connection terminal and the secondary side connection terminal are located on the first side surface, the first substrate, the second substrate and the insulating frame lean against the first side surface of the transformer, the first substrate and the second substrate are substantially parallel to each other, and the first substrate and the second substrate are located on two opposite sides of the transformer.

2. The power adapter as claimed in claim 1, further comprising at least one primary side component and at least one secondary side component, wherein the primary side component is disposed on the first substrate and coupled to the primary side connection terminal, the secondary side component is disposed on the second substrate and coupled to the secondary side connection terminal, and the insulating frame is configured to isolate the primary side component and the secondary side component from one another.

3. The power adapter as claimed in claim 1, wherein a creepage distance from the primary side connection terminal to the secondary side connection terminal is substantially greater than or equal to 6.5 mm.

4. The power adapter as claimed in claim 1, wherein a thickness of the insulating frame is substantially greater than or equal to 0.7 mm.

5. The power adapter as claimed in claim 1, further comprising a plurality of functional pins, and each of the functional pins connecting the first substrate and the second substrate.

6. The power adapter as claimed in claim 1, further comprising a plurality of fixed pins and a frame ground circuit, and the frame ground circuit being disposed on the second substrate.

7. The power adapter as claimed in claim 1, further comprising a connecting port disposed on the second substrate or the first substrate and electrically connected to an external electronic component.

8. The power adapter as claimed in claim 1, further comprising a shielding case covering at least a part of the transformer, the first substrate, and the second substrate.

9. A power adapter, comprising:
   a first substrate, comprising a first terminal set;
   a second substrate, comprising a second terminal set;
   a transformer, comprising a primary side connection terminal and a secondary side connection terminal, wherein the primary side connection terminal is connected to the first terminal set and the secondary side connection terminal is connected to the second terminal set; and
   an insulating frame, disposed between the first substrate and the second substrate,
   wherein the transformer comprises a first side surface and a second side surface opposite to the first side surface, the primary side connection terminal and the secondary side connection terminal are located on the first side surface, and the first substrate, the second substrate and the insulating frame lean against the first side surface of the transformer, and a creepage distance from the primary side connection terminal to the secondary side connection terminal is substantially greater than or equal to 6.5 mm.

10. The power adapter as claimed in claim 9, further comprising at least one primary side component and at least one secondary side component, wherein the primary side component is disposed on the first substrate and coupled to the primary side connection terminal, the secondary side component is disposed on the second substrate and coupled to the secondary side connection terminal, and the insulating frame is configured to isolate the primary side component and the secondary side component from one another.

11. The power adapter as claimed in claim 9, wherein the first substrate and the second substrate are substantially parallel to each other, and the first substrate and the second substrate are located on two opposite sides of the transformer.

12. The power adapter as claimed in claim 9, wherein the first substrate and the second substrate are substantially perpendicular to each other, and the transformer is connected between the first substrate and the second substrate.

13. The power adapter as claimed in claim 9, wherein a thickness of the insulating frame is substantially greater than or equal to 0.7 mm.

14. The power adapter as claimed in claim 9, further comprising a plurality of functional pins, and each of the functional pins connecting the first substrate and the second substrate.

15. The power adapter as claimed in claim 9, further comprising a plurality of fixed pins and a frame ground circuit, and the frame ground circuit being disposed on the second substrate.

16. The power adapter as claimed in claim 9, further comprising a connecting port disposed on the second substrate or the first substrate and electrically connected to an external electronic component.

17. The power adapter as claimed in claim 9, further comprising a shielding case covering at least a part of the transformer, the first substrate, and the second substrate.

* * * * *